US007149495B2

(12) United States Patent
Mizuyama et al.

(10) Patent No.: US 7,149,495 B2

(45) Date of Patent: Dec. 12, 2006

(54) SWITCHING APPARATUS, ELECTRIC FIELD APPLYING METHOD AND SWITCHING SYSTEM

(75) Inventors: Yosuke Mizuyama, Munakata (JP); Shogo Matsubara, Kasuga (JP); Hideaki Horio, Kasuya-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 419 days.

(21) Appl. No.: 10/693,906

(22) Filed: Oct. 28, 2003

(65) Prior Publication Data

US 2004/0183402 A1 Sep. 23, 2004

(30) Foreign Application Priority Data

| | | |
|---|---|---|
| Oct. 29, 2002 | (JP) | P.2002-313885 |
| Nov. 8, 2002 | (JP) | P.2002-325170 |
| Oct. 1, 2003 | (JP) | P.2003-343014 |

(51) Int. Cl.
*H04B 1/28* (2006.01)
*H04B 1/26* (2006.01)
*H01L 41/04* (2006.01)

(52) U.S. Cl. ....................... 455/333; 455/313; 455/323

(58) Field of Classification Search ................ 455/333, 455/338, 339, 313, 323, 325; 29/25.35, 25.41; 360/294.4; 310/357, 311, 300, 338
See application file for complete search history.

(56) References Cited

U.S. PATENT DOCUMENTS 6,489,863 B1 * 12/2002 Taniguchi .................. 333/193
6,778,042 B1 * 8/2004 Terashima et al. .......... 333/205
6,809,459 B1 * 10/2004 Ikeda et al. ............ 310/323.11
6,836,067 B1 * 12/2004 Imai .......................... 313/504
6,912,760 B1 * 7/2005 Uchiyama et al. ......... 29/25.35
6,964,086 B1 * 11/2005 Mikami et al. ............ 29/25.35
2002/0050882 A1 5/2002 Hyman et al.
2002/0109436 A1 8/2002 Peng et al.
2004/0012464 A1 * 1/2004 Ma et al. .................... 333/193
2005/0040734 A1 * 2/2005 Kinoshita .................. 310/348
2005/0122001 A1 * 6/2005 Ma et al. .................... 310/318
2005/0264135 A1 * 12/2005 Hayakawa ............. 310/313 R

FOREIGN PATENT DOCUMENTS

FR 2 753 565 3/1998

(Continued)

OTHER PUBLICATIONS

Chiaki Tanuma, et al., entitled "*A Highly Sensitive Displacing Device Using Piezoelectric Bimorph With Double-Support Structure*", Proceedings of the 4th Meetings on Ferroelectric Materials and Their Applications, Kyoto 1983, Japanese Journal of Applied Physics, vol. 22 (1983) Supplement 22-2, pp. 154-156.

*Primary Examiner*—Sonny Trinh
(74) *Attorney, Agent, or Firm*—Wenderoth, Lind & Ponack, L.L.P.

(57) ABSTRACT

In a switching apparatus having a pair of electrodes including a first electrode and a third electrode, which are provided with a piezoelectric element therebetween and a pair of electrodes including a second electrode and a fourth electrode, which are provided adjacently to the pair of the first and third electrodes in a state where they are electrically insulated from the first and third electrodes, an electric field in a first direction is generated between the first electrode and the third electrode, and simultaneously an electric field in a second direction is generated between the second electrode and the fourth electrode.

24 Claims, 8 Drawing Sheets

FOREIGN PATENT DOCUMENTS

| | | |
|---|---|---|
| GB | 1 584 914 | 2/1981 |
| JP | 11-340702 | 12/1999 |
| JP | 2000-348594 | 12/2000 |
| JP | 2000-348595 | 12/2000 |

* cited by examiner

SWITCHING APPARATUS, ELECTRIC FIELD APPLYING METHOD AND SWITCHING SYSTEM

BACKGROUND OF THE INVENTION

The present invention relates to a switching apparatus, and particularly to a switching apparatus in which insertion loss is small in a band of a high frequency such as higher than GHz band, its electric field applying method, and a switching system.

Recently, a telecommunication system, and particularly a mobile telephone or a radio cellular phone are remarkably developing. For example, in a TDMA type communication system, transmission and reception of a RF signal in a GHz high-frequency band is performed through an antenna. In these systems, usually, one antenna is used alternately for output in a transmission step and for input in a reception step. Accordingly, performance required for a switch in such a system is sufficiently small electric resistance in connection and sufficiently high isolation in disconnection. In a case where the electric resistance is not sufficiently small in connection, insertion loss is produced by generation of Joule's heat, so that consumed electric power becomes large. Further, in a case where isolation is low, signals between two circuits of transmission and reception interfere with each other, so that noise is produced.

As a conventional switching apparatus, for example, an electric switching system using a PIN diode is used. However, it has been known that regarding the semiconductor switch, the larger the frequency band of the RF signal is, the larger the electric resistance becomes, thereby causing the loss.

Further, the loss of the PIN diode is about 1 to 1.5 dB in a practical frequency of 2 GHz. Further, though it is desirable that the isolation is 40 dB and more, the isolation in the present PIN diode is about 15 to 25 dB and it is not enough. Therefore, in this industrial field in which it is expected that the frequency will become higher hereafter, a switching apparatus which is low in insertion loss and high in isolation is required.

Therefore, a switching apparatus using a micromachine system has been proposed. In this example, switching is performed not electrically but mechanically. Accordingly, as long as impedance matching with the RF circuit is performed, the loss and the isolation in the high-frequency band are largely improved compared with those in the semiconductor switch (for example, refer to JP-A-2000-348595 (Page 5, FIG. 1)).

However, in an electrostatic type switch as shown in this example, in order to obtain the practical displacement amount necessary for the mechanical switching, a voltage of several tens of volts is required. Usually, in the mobile telephone, a power source of 5V or less is used. Therefore, a booster generator is necessary to obtain a voltage of 25 to 100V, so that problems of size-up and cost-up are caused.

Therefore, a switch using a piezoelectric actuator has been proposed. By using the piezoelectric actuator, the displacement necessary for switching can be obtained at a voltage of several volts that are further smaller than the voltage in the electrostatic type switch. In this example, only one end of a movable portion is mechanically constrained, and the other end is made free. Namely, a form of a cantilever is shown in this example.

FIG. 4 is a perspective view showing a conventional switching apparatus, in which a piezoelectric element 103 previously polarized in a +Z direction and an elastic plate 102 are superimposed, and a main portion of the switch is composed of a unimorph type piezoelectric actuator. An actuator is fixed on a substrate 101 at a fixed portion 105, whereby such an actuator that one end of the actuator is fixed dynamically and the other thereof is made free, that is, an actuator of a cantilever constitution is formed. Through electrode films (not shown) formed on both surfaces of the piezoelectric element film by a power source 106, an electric field in a direction of −z vertical to the film surface is applied, whereby an expansion in an x-direction is produced. This expansion gives a bending moment to the other end because of the existence of the one fixed end, so that the displacement of the actuator is produced as shown in FIG. 4.

However, in such a form, there is the following problem on manufacture of practical finished items: the free end warps by residual stress in film formation, so that flatness of the switch is impaired (for example, refer to JP-A-11-340702 (FIGS. 2 to 5) and JP-A-2000-348594 (FIG. 1)).

Further, even if a piezoelectric actuator having a fixed—fixed beam constitution is used in order to improve the defect of the piezoelectric actuator having the above cantilever constitution, since both ends of a movable portion are fixed, there is usually little displacement of the actuator. Therefore, in order to improve the displacement property of the actuator having a fixed—fixed beam constitution, there is a switching apparatus in which ingenuity is exercised in a fixing method of both ends (for example, refer to Jpn. J. Appl. Phys. 22. Suppl. 2, 154 (1988)).

However, the improvement in the displacement amount achieved by such method is not large, and a contact in the fixing end for generating a bending moment requires a size of some degree, so that real trial manufacture is difficult, and further, the cost is increased. Therefore, this method is unfit for mass production of the actuator.

SUMMARY OF THE INVENTION

The invention has been made in view of the above conventional problems, and its object is to provide a switching apparatus which has a small contact and can obtain large displacement at a low cost, and its electric field applying method.

Therefore, the switching apparatus of the invention includes a substrate, a movable portion which has both ends fixed on the substrate and can operate in relation to the substrate, a switching electrode which is electrically insulated from the movable portion and provided on the movable portion, and a gap electrode which is provided opposed to the switching electrode, and electrically conducts when the switching electrode comes into contact with the gap electrode with the operation of the movable portion. Further, the switching apparatus of the invention has the following constitution: the movable portion comprises a piezoelectric element, a first electrode provided on the substrate side of the piezoelectric element, a third electrode which is provided on the substrate side of the piezoelectric element and is electrically insulated from the first electrode, a second electrode provided on the opposite side to the substrate side of the piezoelectric element so as to be opposed to the first electrode, and a fourth electrode which is provided on the opposite side to the substrate side of the piezoelectric element so as to be opposed to the third electrode and which is electrically insulated from the second electrode; and a voltage applying unit is provided, which applies voltages to at least any one of the first electrode and the second electrode, and at least any one of the third electrode and the fourth electrode.

The switching apparatus according to the invention makes it possible to reduce insertion loss in the high-frequency band, which was a problem in the conventional semiconductive switch. Further, according to the invention, the film-warp resolution and the displacement improvement, which were problems in the conventional micromachine switch, and are incompatible problems, are improved. Furthermore, according to the invention, a curved portion is provided for the actuator, whereby good contact is obtained in the switch contact, and the low electric resistance is provided.

According to the first aspect of the invention, a switching apparatus includes a substrate, a movable portion which has both ends fixed on the substrate and can operate in relation to the substrate, a switching electrode which is electrically insulated from the movable portion and provided on the movable portion, and a gap electrode which is provided opposed to the switching electrode, and electrically conducts when the switching electrode comes into contact with the gap electrode with the operation of the movable portion. Herein, the movable portion comprises a piezoelectric element, a first electrode provided on the substrate side of the piezoelectric element, a third electrode which is provided on the substrate side of the piezoelectric element and is electrically insulated from said first electrode, a second electrode provided on the opposite side to the substrate side of the piezoelectric element so as to be opposed to the first electrode, and a fourth electrode which is provided on the opposite side to the substrate side of the piezoelectric element so as to be opposed to the third electrode and which is electrically insulated from the second electrode; and a voltage applying unit is provided, which applies voltages to at least any one of the first electrode and the second electrode, and at least any one of the third electrode and the fourth electrode. Thus, in the piezoelectric element, between the region interposed between the first electrode and the third electrode, and the region interposed between the second electrode and the fourth electrode, a curved portion can be formed. Therefore, the displacement of the movable portion becomes very large.

According to the second aspect of the invention, a direction of an electric field generated in the piezoelectric element by the voltage applied by the voltage applying unit is different between the first electrode and the second electrode, and between the third electrode and the fourth electrode. Hereby, in the piezoelectric element, between the region interposed between the first electrode and the third electrode, and the region interposed between the second electrode and the fourth electrode, a curved portion can be formed. Therefore, the displacement of the movable portion becomes very large.

According to the third aspect of the invention, a direction of a stress generated in the piezoelectric element by the voltage applied by the voltage applying unit is different between the first electrode and the second electrode, and between the third electrode and the fourth electrode. Thus, in the piezoelectric element, between the region interposed between the first electrode and the third electrode, and the region interposed between the second electrode and the fourth electrode, a curved portion can be formed. Therefore, the displacement of the movable portion becomes very large.

According to the fourth aspect of the invention, the substrate includes a fixing portion and a different-in-level portion, both ends of the movable portion are fixed onto the fixing portion, and the movable portion operates on the different-in-level portion. Thus, the operation of the movable portion can be performed surely.

According to the fifth aspect of the invention, the switching electrode is formed so as to stride over the second electrode and the fourth electrode on the top of the movable portion. Accordingly, since the switching electrode is provided in the portion where the displacement is large, the switching electrode can be surely brought into contact with the gap electrode.

According to the sixth aspect of the invention, the voltage applied between the first electrode and the second electrode is different from the voltage applied between the third electrode and the fourth electrode. Thus, the deformed shape and the displacement amount which are produced between the first electrode and the third electrode, and between the second electrode and the fourth electrode can be controlled, so that the shape of the movable portion can be optimized.

According to the seventh aspect of the invention, the shape of the switching electrode during operating of the movable portion is, in its portion opposed to the gap electrode, convex toward the gap electrode. Accordingly, the contact between the gap electrode and the switching electrode can be reliably performed.

According to the eighth aspect of the invention, the convex shape of the contact portion of the switching electrode with the gap electrode is more approximate to a flat shape than the convex shape of the non-contact portion of the switching electrode with the gap electrode, of the switching electrode. Thus, the contact between the gap electrode and the switching electrode can be surely performed.

According to the ninth aspect of the invention, a switching apparatus includes a substrate, a movable portion which has both ends fixed on the substrate and can operate in relation to the substrate, a switching electrode which is electrically insulated from the movable portion and provided on the movable portion, and a gap electrode which is provided opposed to the switching electrode, and electrically conducts when said switching electrode comes into contact with the gap electrode with the operation of the movable portion. The movable portion comprises a piezoelectric element; first, third and fifth electrodes which are provided on the substrate side of the piezoelectric element and electrically insulated from one another; and second, fourth and sixth electrodes which are respectively opposed to the first, third and fifth electrodes with the substrate between on the opposite side to the substrate side of the piezoelectric element, and electrically insulated from one another. Further, a voltage applying unit is provided, which applies voltages to at least either the first electrode or the second electrode, at least either the third electrode or the fourth electrode, and at least either the fifth electrode or the sixth electrode. Thus, in the piezoelectric element, between the region interposed between the first electrode and the second electrode and the region interposed between the third electrode and the fourth electrode, and between the region interposed between the fifth electrode and the sixth electrode and the region interposed between the third electrode and the fourth electrode, at least two curved portions can be formed. Therefore, the larger displacement of the movable portion can be obtained.

According to the tenth aspect of the invention, a direction of an electric field generated in the piezoelectric element by the voltage applied by the voltage applying unit is different between the first electrode and the second electrode, between the fifth electrode and the sixth electrode, and between the third electrode and the fourth electrode. Thus, in the piezoelectric element, between the region interposed between the first electrode and the second electrode and the region interposed between the third electrode and the fourth electrode, and between the region interposed between the fifth electrode and the sixth electrode and the region interposed between the third electrode and the fourth electrode, at least two curved portions can be formed. Therefore, the larger displacement of the movable portion can be obtained.

According to the eleventh aspect of the invention, a direction of a stress generated in the piezoelectric element by the voltage applied by the voltage applying unit is different between the first electrode and the second electrode, between the fifth electrode and the sixth electrode, and between the third electrode and the fourth electrode. Accordingly, in the piezoelectric element, between the region interposed between the first electrode and the second electrode and the region interposed between the third electrode and the fourth electrode, and between the region interposed between the fifth electrode and the sixth electrode and the region interposed between the third electrode and the fourth electrode, at least two curved portions can be formed. Therefore, the larger displacement of the movable portion can be obtained.

According to the twelfth aspect of the invention, the substrate includes a fixing portion and a different-in-level portion, both ends of the movable portion are fixed onto the fixing portion, and the movable portion operates on the different-in-level portion. Thus, the operation of the movable portion can be surely performed.

According to the thirteenth aspect of the invention, the switching electrode is formed on the fourth electrode on the top of the movable portion. Thus, since the switching electrode is provided in the portion where the displacement is large, the switching electrode can be surely brought into contact with the gap electrode.

According to the fourteenth aspect of the invention, the voltage applied between the first electrode and the second electrode, the voltage applied between the third electrode and the fourth electrode, and the voltage applied between the fifth electrode and the sixth electrode are different from one another. Accordingly, the deformed shapes and the displacement amounts which are produced respectively, in the piezoelectric element, in the region interposed between the first electrode and the second electrode, in the region interposed between the third electrode and the fourth electrode, and in the region interposed between the fifth electrode and the sixth electrode can be controlled, so that the shape of the movable portion can be optimized.

According to the fifteenth aspect of the invention, the voltage applied between the first electrode and the second electrode is the same as the voltage applied between the fifth electrode and the sixth electrode. Thus, since the unit which applies the voltages to the both regions can be used in common, cost of the switching apparatus can be reduced.

According to the sixteenth aspect of the invention, the shape of the switching electrode during operating of the movable portion is, in its portion opposed to the gap electrode, convex toward the gap electrode. Thus, the contact between the gap electrode and the switching electrode can be surely performed.

According to the seventeenth aspect of the invention, the convex shape of the contact portion of the switching electrode with the gap electrode is more approximate to a flat shape than the convex shape of the non-contact portion of the switching electrode with the gap electrode. Thus, the contact between the gap electrode and the switching electrode can be performed satisfactorily.

According to the eighteenth aspect of the invention, the first electrode is formed near a first end of both ends of the movable portion, the fifth electrode is formed near a second end on the opposite side to the first end, and the third electrode is formed near a central portion of the movable portion. Thus, the operation of the movable portion in relation to the fixed portion can be performed more smoothly.

According to the nineteenth aspect of the invention, in a switching apparatus having a first electrode pair provided with a piezoelectric element between, and a second electrode pair provided adjacently to the first electrode pair in a state where the second electrode pair is electrically insulated from the first electrode pair, an electric field in a first direction is generated between the first electrode pair, and simultaneously an electric field in a second direction is generated between the second electrode pair. Accordingly, since a curved portion is formed between the region interposed between the first electrode pair, and the region interposed between the second electrode pair in the piezoelectric element, the displacement of the movable portion becomes larger.

According to the twentieth aspect of the invention, the potential difference produced between the first electrode pair is nearly equal to the potential difference produced between the second electrode pair. Accordingly, since unevenness of the displacement amount of the piezoelectric element in each region can be reduced, the load applied onto the piezoelectric element can be made more uniform, and further a life of the piezoelectric element can be prolonged more.

According to the twenty-first aspect of the invention, by a common power source, the potential difference is produced between the first electrode pair and the potential difference is produced between the second electrode pair. Accordingly, since unevenness in the potential difference supplied to each electrode pair is difficult to be produced, the movable portion can be deformed more exactly, and further the operation of the switching apparatus can be performed more reliably. Further, since the number of power sources can be reduced, the switching apparatus can be realized at a low cost.

According to the twenty-second aspect of the invention, in a switching apparatus using a piezoelectric element, plural electrode pairs for applying electric fields to the piezoelectric element are included, and the electric fields in the plural electrode pairs are applied to the piezoelectric element so that the directions of the electric fields are nearly opposite to each other between the adjacent electrode pairs. Thus, a curved portion is formed between the region interposed between the first electrode pair, and the region interposed between the second electrode pair in the piezoelectric element, and further the deforming directions of the movable portion can be made opposite to each other with the curved portion on the boundary between. Therefore, the displacement of the movable portion becomes larger.

According to the twenty-third aspect of the invention, the piezoelectric element is formed by a thin film process. Thus, since the thickness of the piezoelectric element can be made very thin, the displacement of the piezoelectric element can be made larger. Accordingly, the required displacement amount can be secured at a lower voltage.

According to the twenty-fourth aspect of the invention, the piezoelectric element is formed on an MgO substrate. Thus, since a good PZT crystal can obtained, the switching apparatus which does not cause an insulation break and has high reliability can be obtained.

According to the twenty-fifth aspect of the invention, the piezoelectric element is formed on a silicon substrate. Accordingly, the switching apparatus having high reliability can be realized at a low cost.

According to the twenty-sixth aspect of the invention, a switching system using a piezoelectric element comprises a piezoelectric element, plural electrode pairs for applying electric fields to this piezoelectric element, electric wirings for supplying electric power to these electrode pairs, an electrode pair for electrically connecting an antenna and a high-frequency circuit for transmission and reception, and a coupler for matching the piezoelectric element to the high-frequency circuit. Herein, the electric fields in the plural electrode pairs are applied to the piezoelectric element so that the directions of the electric fields are nearly opposite to each other between the adjacent electrode pairs. Hereby, it is possible to provide the switching system in which the operation is surer, reliability is high, and cost is low.

According to the twenty-seventh aspect of the invention, the switching system is packaged by a high-frequency shielding material. Accordingly, since an influence of the high-frequency noise on the switching system can be suppressed to a minimum, the switching system having the high reliability can be provided.

According to the twenty-eighth aspect of the invention, the high-frequency shielding material is composed of glass or fused silica, whereby the switching system having a low cost and high reliability can be shield from the high-frequency noise.

According to the twenty-ninth aspect of the invention, a switching apparatus using a piezoelectric element includes a piezoelectric element, a first movable portion including the piezoelectric element, a pair of second movable portions which couple to the first movable portion and include the piezoelectric element, and plural electrode pairs for applying electric fields to the first movable portion and the second movable portion. An electric field applying unit is provided, which applies electric fields so that the directions of the electric fields are nearly opposite to each other between the adjacent electrode pairs of the plural electrode pairs. Thus, the displacement amount of the whole of the movable portion can be made larger, so that it is possible to greatly suppress occurrence of such disadvantage that the switching apparatus in a disconnection state enters the connection state by the shock from the outside.

According to the thirtieth aspect of the invention, the first movable portion is coupled to the second movable portion in the largest displacement portion of the second movable portion, whereby the displacement amount of the whole of the movable portion can be made larger.

According to the thirty-first aspect of the invention, a switching system using a piezoelectric element includes a piezoelectric element, a first movable portion including the piezoelectric element, a second movable portion provided around the first movable portion and including the piezoelectric element, plural electrode pairs for applying electric fields to the first movable portion and the second movable portion, electric wirings for supplying electric power to these electrode pairs, an electrode pair for electrically connecting an antenna and a high-frequency circuit for transmission and reception, and a coupler for matching the piezoelectric element to the high-frequency circuit. Thus, the electric fields in the plural electrode pairs are applied to the piezoelectric element so that the directions of the electric fields are nearly opposite to each other between the adjacent electrode pairs. Accordingly, it is possible to provide the switching system in which the operation is surer, the reliability is high, and the loss is low.

DETAILED DESCRIPTION OF THE PREFERRED EMBODIMENTS

First Embodiment

A first embodiment of the invention will be described below with reference to drawings.

Figure 1:
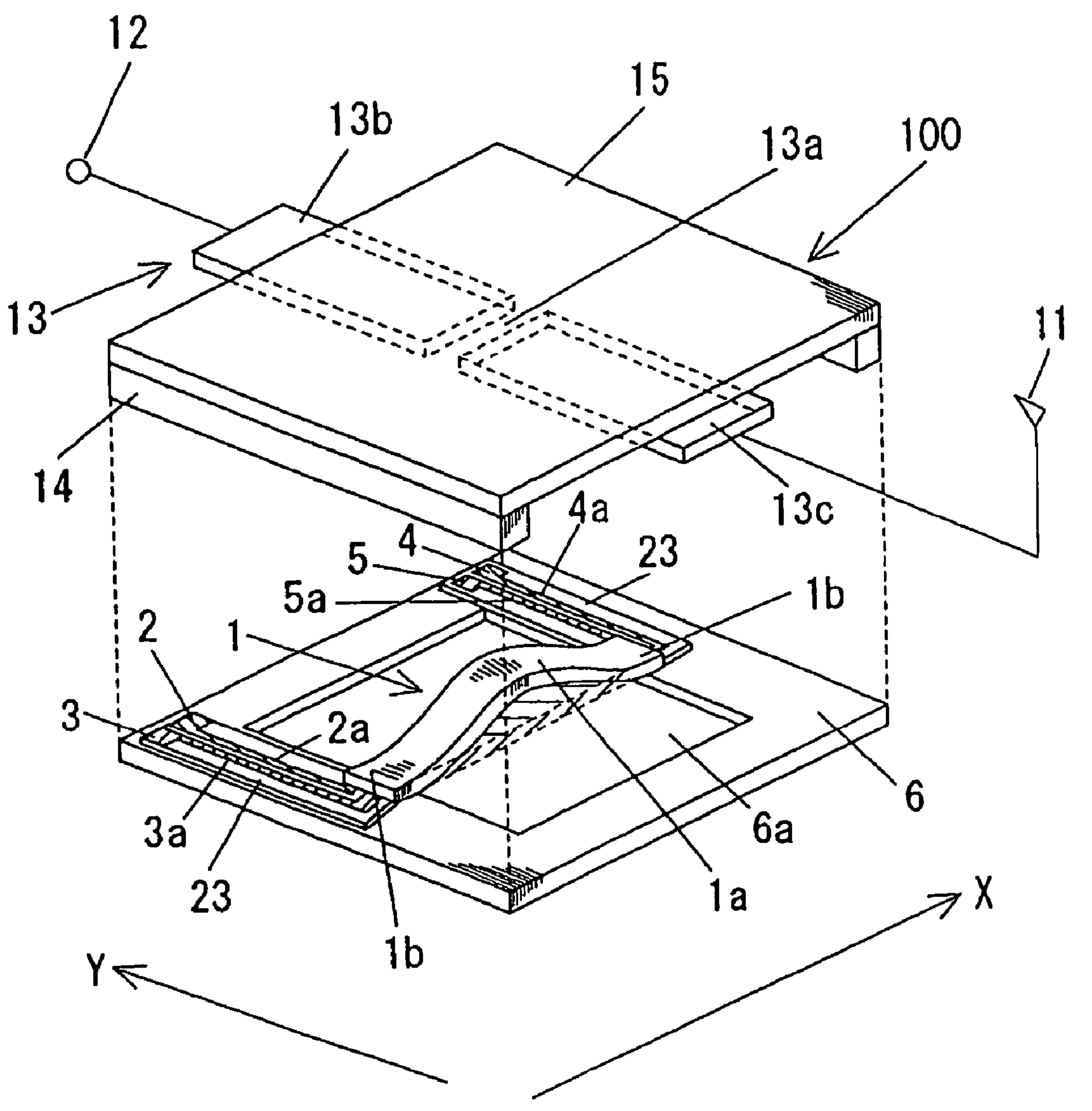
FIG. 1 is an exploded perspective view showing the constitution of a switching apparatus in a first mode for carrying out the invention.
Figure 2:
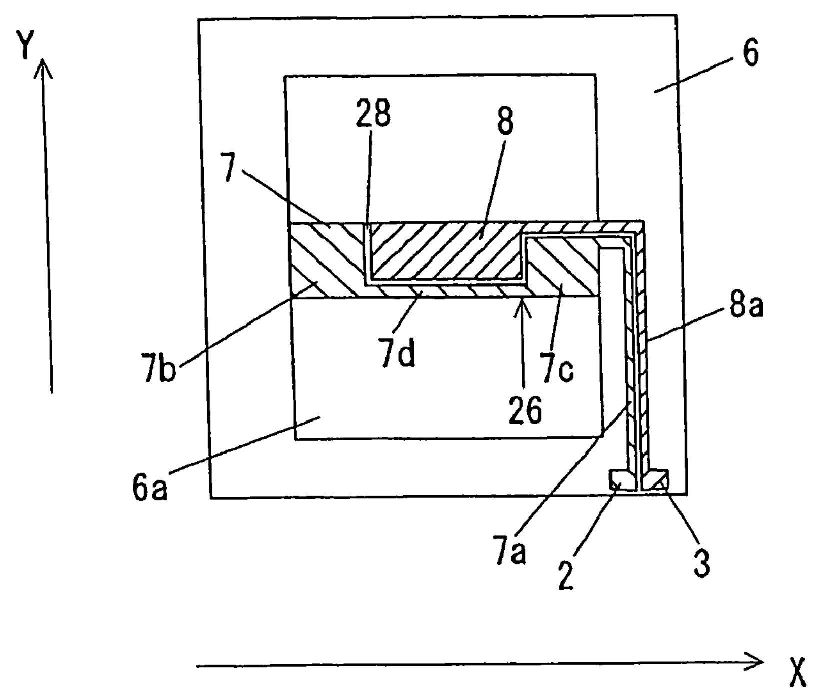
FIG. 2 is a diagram showing the substrate-side electrode (lower electrode) structure of the switching apparatus in the first mode.
Figure 3:
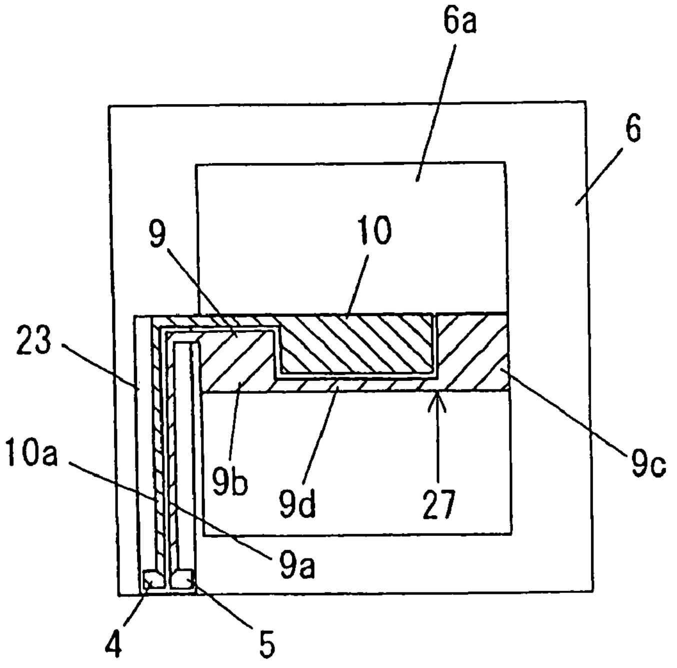
FIG. 3 is a diagram showing the gap electrode-side electrode (upper electrode) structure of the switching apparatus in the first mode.
Figure 5:
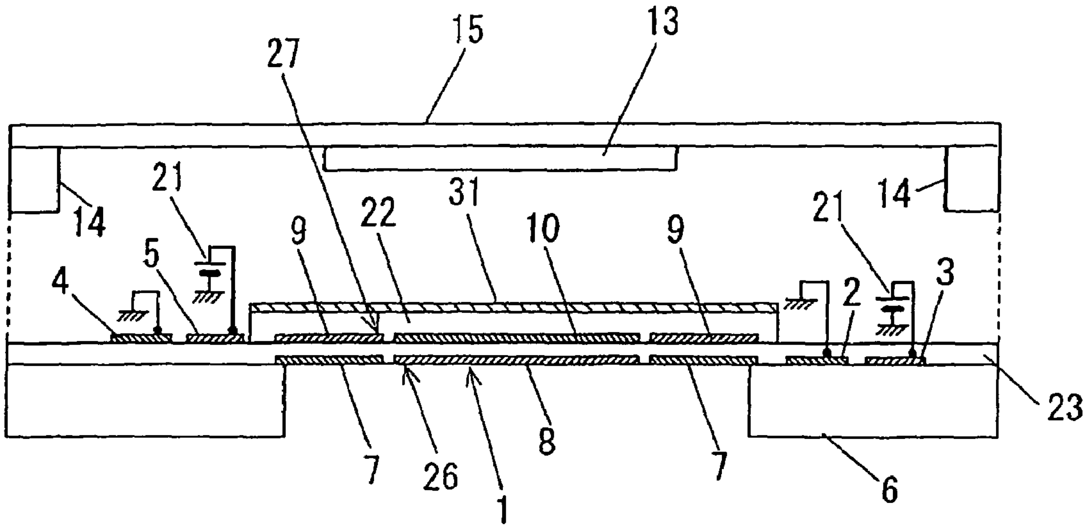
FIG. 5 is an exploded side view including an actuator in the stationary state of the switching apparatus in the first mode.

FIG. 1 is an exploded perspective view showing a switching apparatus constructed in accordance with the first embodiment of the invention. FIG. 2 is a diagram showing the substrate-side electrode (lower electrode) structure of the switching apparatus in the first embodiment, FIG. 3 is a diagram showing the gap electrode-side electrode (upper electrode) structure of the switching apparatus in the first embodiment, and FIG. 5 is an exploded side view including an actuator in the stationary state of the switching apparatus in the first embodiment.

In the figures, reference numeral 100 is a switching apparatus, and the switching apparatus 100 comprises a substrate 6, an actuator 1, an upper substrate 15, a gap electrode 13, and a spacer 14.

The constitution of the switching apparatus will be described below in detail with reference to FIGS. 1 to 3 and FIG. 5

The substrate 6 is formed of an MgO material having a plate thickness of 380 μm. At this time, it is preferable that the substrate 6 is a MgO monocrystalline substrate because its plate can make nearly uniform the polarized directions of a piezoelectric thin film element to be formed thereafter. It is preferable that the plate thickness is about 100 μm to 500 μm from the viewpoints of security of the actuator's strength and the optimum displacement amount. Further, as the material, a $SiO_2$ substrate can be used. In the substrate 6, a step portion **6*a* is formed. As long as this step portion 6*a* has such a different-in-level that the actuator 1 can operate, the step portion may be an opening portion. However, it is preferable that the opening portion is smaller from a viewpoint of rigidity of the switching apparatus 100. In case that there is only the different-in-level but not an opening, the rigidity of the switching apparatus 100** becomes very high. Therefore, this case is most preferable from the viewpoints of operating accuracy and reliability of the apparatus.

In the middle in a Y-direction of the step portion 6*a*, the actuator 1 is arranged so as to stride over the step portion 6*a*. This actuator 1 comprises a movable portion 1*a* located on the step portion 6*a*, and fixed portions 1*b* fixed to the substrate 6 at both ends of the actuator 1, thereby forming a patterned fixed—fixed beam constitution. By arranging the actuator 1 in the middle of the step portion 6*a*, influences on the substrate 6 due to deformation of the actuator 1 can be made nearly uniform. Therefore, this arrangement is most preferable from the viewpoints of operating accuracy and reliability of the elements.

Further, the actuator 1 comprises a piezoelectric thin film element 23, a lower electrode 26 and an upper electrode 27 which apply electric fields to the piezoelectric thin film element 23, an elastic plate 22, and a switching electrode 31.

The piezoelectric thin film element 23 is formed of the material including ceramic material such as PZT, PLT, and PZLT. The film thickness of the piezoelectric thin film element 23 is about 1 to 20 μm. The piezoelectric thin film element 23 is formed by using a thin film forming technology such as sputtering, CVD, and sol-gel. Further, it is preferable that the polarized directions of the piezoelectric thin film element 23 are gathered in one direction as much as possible because the displacement amount can be made larger. In this mode, the displacement direction is a Z-direction (herein, direction of +Z). It is preferable that this piezoelectric thin film element 23 is divided in the vicinity of a portion where the displacement of the actuator 1 becomes largest, and more specifically in a range of about ±10% of the length Lx of the movable portion 1*a* from a center line in an X-direction of the movable portion 1*a*. By such the constitution, the displacement of the actuator 1 can be made larger.

Next, the lower electrode 26 is provided on the substrate-side surface of the piezoelectric thin film element 23 directly or with another layer (for example, a fixing layer that makes fixability between layers good or an insulation layer that makes isolation between layers good) between. When the length of the movable portion 1*a* in the X-direction is taken as Lx, in positions of about ¼ Lx and ¾ Lx from one end portion of the different-in-level portion 6*a*, the lower electrode 26 is divided into a first electrode 7 and a second electrode 8. Herein, a first electric potential is applied to the first electrode 7, and a second electric potential that is higher than the first electric potential is applied to the second electrode 8.

It is preferable that this divisional position is $\frac{1}{10}$ Lx to ⅓ Lx and the divisional position on the opposite side is ⅔ Lx to $\frac{9}{10}$ Lx because the good operation of the movable portion 1*a* can be realized.

The first electrode 7 has two regions 7*b* and 7*c* with the second electrode 8 between them. The region 7*b* and the region 7*c* are connected by a connecting portion 7*d* provided adjacently to the second electrode 8 at the end portions in the Y-direction of the actuator 1 so that their electric potentials become the same.

In a boundary region between the first electrode 7 and the second electrode 8, a gap 28 is formed as not to cause discharge even if the potential difference is produced between the electrodes.

Further, the first electrode 7 and the second electrode 8 are connected respectively to a first pad 2 and a second pad 3 in the lower electrode 26 through a first wiring portion 7*a* and a second wiring portion 8*a*. The first pad 2 is connected to the earth, and the second pad 3 is connected to a power source 21.

In this mode, the first wiring portion 7*a* and the second wiring portion 8*a* are led on the same side, and the first pad 2 and the second pad 3 are provided adjacently. However, the first wiring portion 7*a* and the second wiring portion 8*a* may be led on the opposite side to each other with the different-in-level portion 6*a* therebetween. In this case, since the first pad 2 and the second pad 3 are provided separately, compared with the case where they are provided adjacently, it is possible to reduce the occurrence of a disadvantage in a process such as short circuit in connection to the pad.

Figure 9:
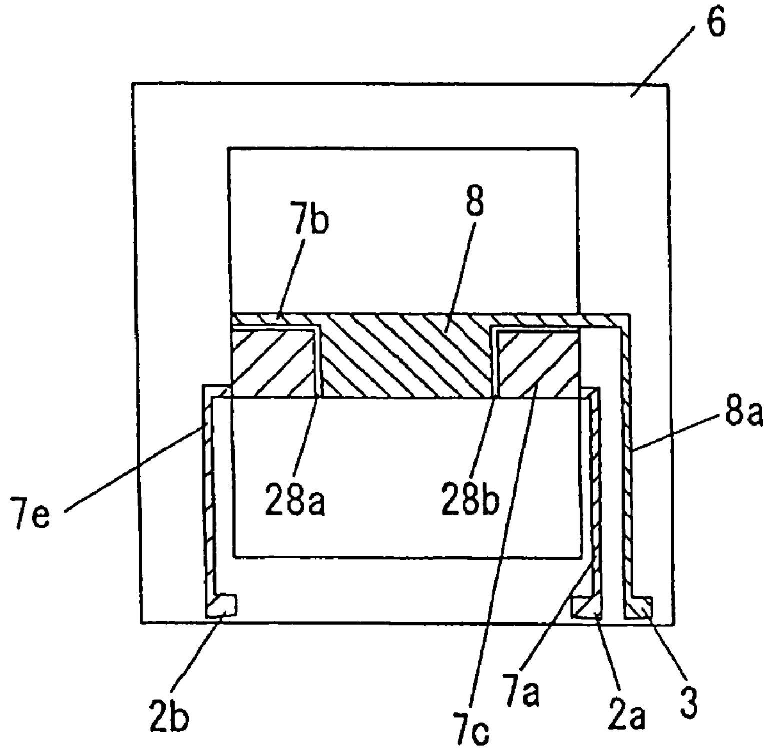
FIG. 9 is a diagram showing another example of the electrode constitution in the first mode.

Further, in the above mode, the electrode is divided into the first electrode 7 and the second electrode 8. However, the electrode may be divided into three or more. An example will be described below. FIG. 9 is a diagram showing another example of the electrode constitution in the first mode of the invention. As shown in FIG. 9, the connecting portion 7*d* is not provided but a region 7*c* may be connected by a first wiring portion 7*a* to a first pad 2*a*, and a region 7*b* may be connected by a third wiring portion 7*e* to a third pad provided on the opposite side to the first pad 2*a*. In this case, a gap 28*a* is formed between the region 7*b* and the second electrode 8, and a gap 28*b* is formed between the region 7*c* and the second electrode 8. Further, the second electrode 8 is formed so that its shape becomes nearly symmetric about a centerline in the X-direction of the movable portion 1*a*. By this constitution, division of the electric potential between the first electrode 7 and the second electrode 8 becomes better. Further, since the deformation of the movable portion 1*a* becomes nearly left-and-right symmetric, better deformation of the movable portion 1*a* can be realized.

Next, as shown in FIG. 3, the upper electrode 27 is formed on the opposite side to the lower electrode 26 in relation to the piezoelectric thin film element 23. The upper electrode 27 is divided into two regions similarly to the lower electrode 26, and a third electrode 9 and a fourth electrode 10 are respectively formed. The respective electrodes 9 and 10 are connected through a third wiring portion 9*a* and a fourth wiring portion 10*a* to a third pad 5 and a fourth pad 4. The third pad 5 is connected to the earth, and the fourth pad 4 is connected to the power source 21. Regarding other points than these points, also, all the constitution/action of the lower electrode 26 can be adopted in the upper electrode 27.

As is clear from FIG. 5, in the lower electrode 26 and the upper electrode 27, the first electrode 7 of the lower electrode 26 and the third electrode 9 of the upper electrode 27 make a pair, and the first electric potential which operates the movable portion 1*a* is applied to their electrodes with the piezoelectric thin film element 23 therebetween. Further, the second electrode 8 in the lower electrode 26 and the fourth electrode 10 in the upper electrode 27 make a pair, and the second electric potential, which is different from the first electric potential, is applied to their electrodes with the piezoelectric thin film element 23 therebetween.

It is preferable that the first electrode 7 and the second electrode 8 in the lower electrode 26 are coated with an insulating layer (not shown). Regarding this point, the fourth electrode 10 and the third electrode 9 in the upper electrode 27 are similar to the first electrode 7 and the second electrode 8 in the lower electrode 26.

As the material used in the lower electrode 26 and the upper electrode 27, metal such as Pt, Au, Ag, and Al or alloy including these materials can be used. Further, in a case where the film thickness of the electrode is about 0.1 to 2 μm, increase of a resistance value in the electrode can be suppressed. Further, it is preferable that its thickness is 1 μm or more because the electrode can have both an electrode function and an elastic film function.

Further, though the earth to which the first pad 2 is connected and the earth to which the third pad 5 is connected are shown separately, the earth may be used in common. Further, the electric power 21 to which the second pad 3 is connected and the electric power 21 to which the fourth pad 4 is connected may be used in common or separately.

Next, the elastic plate 22 of the actuator 1 will be described. The elastic plate 22 is formed directly or through another layer on at least one of the piezoelectric thin film element 23 and the upper electrode 27 or the lower electrode 26. This elastic plate 22 is formed of at least one material selected from a film formed of any one metal of Ni, Ti, Cr, Au, Pt, Al, and Cu or their alloy, or their oxide films such as $SiO_2$, $TiO_2$, and $Al_2O_3$. The elastic plate 22 has the thickness of 0.1 to 10 μm, and the most suitable thickness is set so that the actuator can obtain the largest displacement in this range. This elastic plate 1 has a function of adjusting hardness of the whole of the actuator.

Next, a switching electrode 31 of the actuator 1 will be described. The switching electrode 31 is formed on the elastic plate 22 directly or through another layer. This switching electrode 31 is formed of a metal material. The switching electrode 31 is formed so as to be opposed to the gap electrode 13 formed on the upper substrate 15.

In the actuator 1, the constitution in which the elastic plate 22 and the switching electrode 31 are not provided is also contemplated. In this case, the upper electrode 27 comes into contact with the gap electrode 13.

Next, the spacer 14 is provided on the substrate 6 or the piezoelectric thin film element 23 directly or through another material (for example, adhesive). As a material constituting the spacer 14, a glass ball, a zirconia ball, or adhesive including a resin ball is contemplated (a case where a ball is not included is also contemplated). The thickness of the spacer 14 is determined according to the displacement amount of the movable portion 1*a* or the thickness of the gap electrode.

The upper substrate 15 is joined onto the spacer 14. It is desirable that the upper substrate 15 has enough strength so as not to break in case that the switching apparatus 100 receives an external force. It is preferable that metal material is used as the material of the upper substrate 15.

On the surface that is opposed to the actuator 1, of the upper substrate 15, the gap electrode 13 is provided. In the gap electrode 13, a gap portion 13 extending in the X-direction is formed. By this gap portion 13*a*, a region 13*b* connected to a terminal 12 is electrically insulated from a region 13C connected to a transmission and reception antenna 11. Namely, a non-conductive state is usually between the terminal 12 coupled to a high-frequency circuit and the transmission and reception antenna 1. The extending direction of the region 13*b* and the region 13*c* with the gap portion 13 therebetween is the Y-direction, and the relation between the regions 13*b*, 13*c* and the actuator 1 extending in the X-direction is nearly orthogonal (If exact contact is possible, it is not necessary for them to be orthogonal).

The distance between the gap electrode 13 and the switching electrode 31 is about 1 to 5 μm when the actuator 1 is in a non-deformation state. Since the distance between them is in this range, when the actuator 1 deforms, the gap electrode 13 and the switching electrode 31 can be reliably brought into contact with each other. Therefore, reliability of the switching apparatus 100 can be improved. Further, it is preferable that this distance is 80% or less of the maximum displacement amount of the actuator 1. By such the constitution, even if a little secular change is produced in the actuator 1, the stable operation of the switching apparatus can be realized. Further, in a case where this distance is 1 μm or more, even if a little shock is given from the outside to the apparatus, the erroneous operation of the switching apparatus is unlikely. Therefore, the reliability of the switching apparatus can be improved.

Next, the operation of the switching apparatus 100 having the above constitution will be described with reference to FIGS. 5, 6 and 10.

Figure 6:
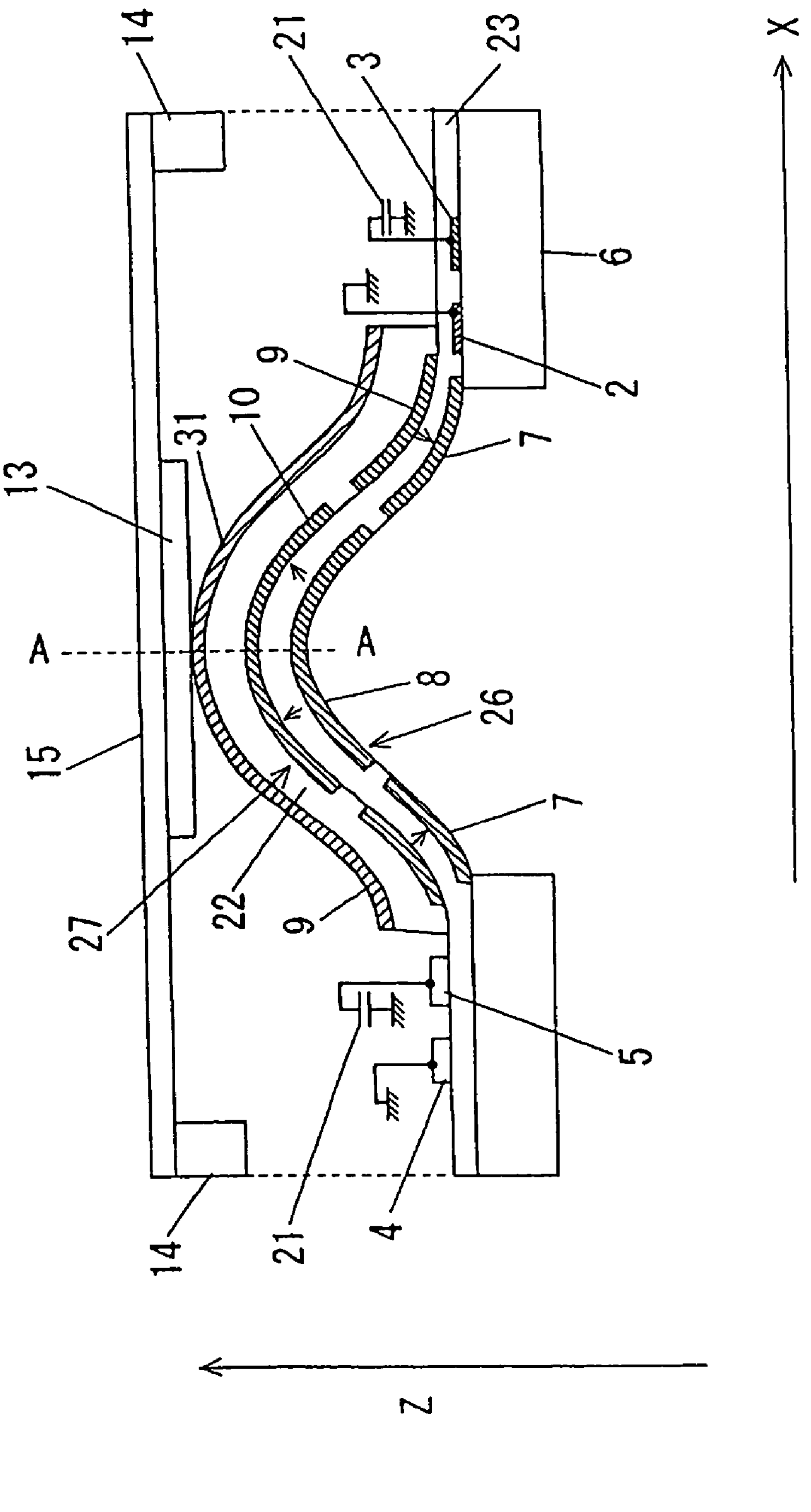
FIG. 6 is an exploded side view including the actuator in the displacement state of the switching apparatus in the first mode.

FIG. 6 is an exploded view of the switching apparatus according to the first mode for carrying out the invention, including the actuator in the displacement state. FIG. 10 is a partially sectional view taken along a line of A—A of FIG. 6.

As shown in FIG. 5, in a case where the electric potential is not applied between the lower electrode 26 and the upper electrode 27, the piezoelectric thin film element 23 does not cause the displacement. Therefore, the actuator 1 becomes linear (namely, flat) in FIG. 5.

As shown in FIG. 6, in a case where the actuator is operated, between the first electrode 7 of the grounded lower electrode 26 and the third electrode 9 of the upper electrode 27 connected to the power source 21 which generates a positive electric potential, an electric field is produced in a direction of −Z of the actuator 1, that is, in the opposite direction to the displacement direction of the actuator 1. Therefore, in the piezoelectric thin film element 23 polarizing mainly in a direction of +Z, tensile strain along the x-y plane (compressive strain along z direction) is yielded. Therefore, the piezoelectric thin film element 23 deforms into a convex shape.

Simultaneously, between the fourth electrode 10 of the grounded upper electrode 27 and the second electrode 8 of the lower electrode 26 connected to the power source 21 which generates the positive electric potential, an electric field is produced in the direction of +Z of the actuator 1, that is, in the same direction as the displacement direction of the actuator 1. Therefore, in the piezoelectric thin film element 23 polarizing mainly in the direction of +Z, compressive strain along the x-y plane (tensile strain along z direction) is yielded. Therefore, the piezoelectric thin film element 23 deforms into a convex shape.

Both of these effects are cooperated with each other, whereby the actuator 1 so deforms, as a whole, that the movable portion 1*a* has the largest height in the displacement direction in FIG. 6. By using this electric applying method, two inflection points are formed in nearly equal positions from a center of the movable portion 1*a*, and a maximum displacement point is located near the center. Therefore, the portion of the maximum displacement becomes nearly horizontal. Accordingly, better contact between the switching electrode 31 located on the maximum displacement portion and the gap electrode 13 can be realized.

Figure 10:
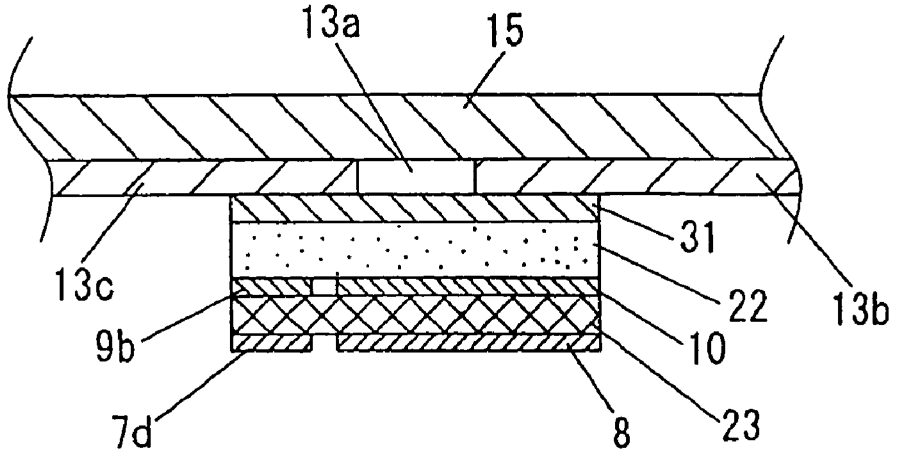
FIG. 10 is a partially sectional view taken along a line of A—A in FIG. 6.

At this time, as shown in FIG. 10, the gap electrode 13 and the switching electrode 31 come into contact with each other so that the gap portion 13*a* of the gap electrode 13 conducts. Since the longitudinal direction (Y-direction) of the gap electrode 13 is orthogonal to the longitudinal direction (X-direction) of the actuator 1 (that is, the gap direction (X-direction) is orthogonal to the width direction (Y-direction) of the actuator), the nearly linear (flat) switching electrode 31 can be brought into contact with both of the first electrode 13*b* and the second electrode 13*c* which are spaced with the gap portion 13*a* therebetween. Therefore, the switching electrode 31 can come into contact with the first electrode 13*b* and the second electrode 13*c* uniformly. Further, even if the attachment position of the actuator 1 is shifted a little to the left or right by a manufacturing error, the switching electrode 31 can be brought into contact with both the first electrode 13*b* and the second electrode 13*c*.

Figure 7:
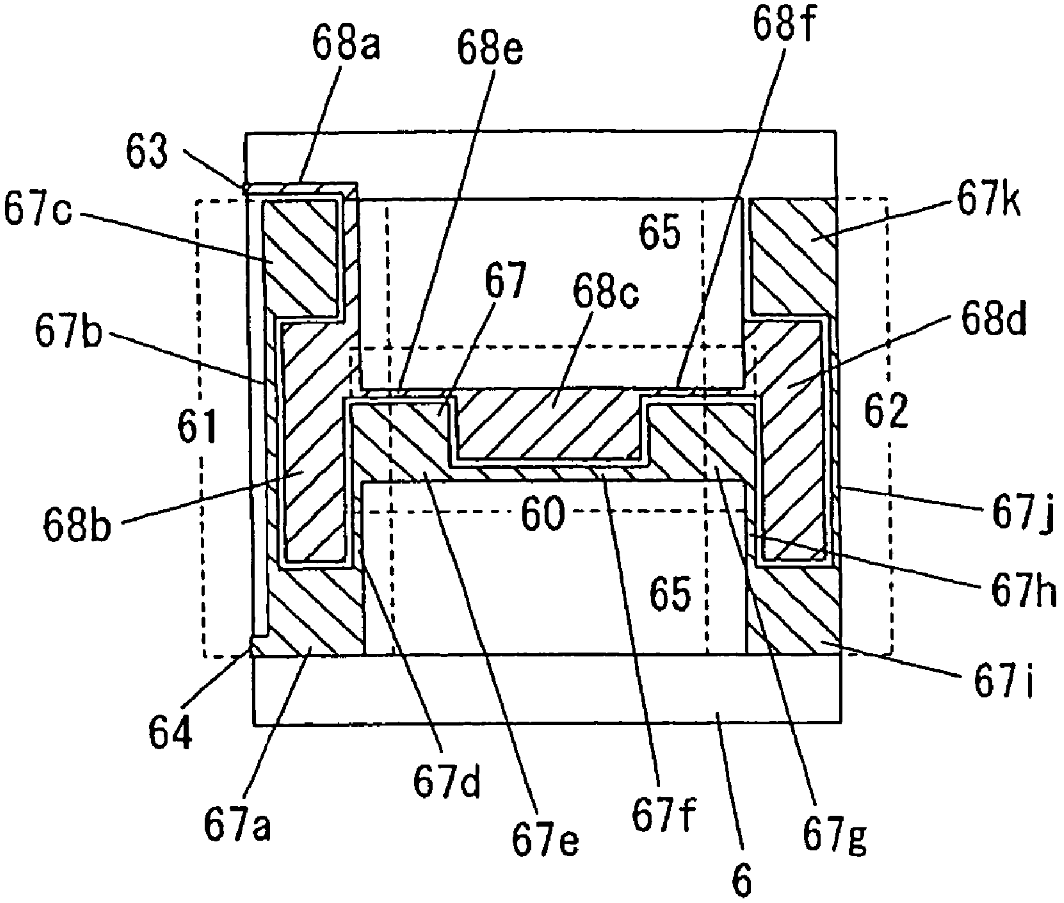
FIG. 7 is a front view of a switching apparatus in a second mode for carrying out the invention.

Specifically, embodiments suitable for the switching apparatus described in the invention will be described below with reference to FIGS. 5, 6 and 7.

On the substrate 6 formed of monocrystalline MgO, the first electrode 7 in the layered lower electrode 26 formed of Pt, the second electrode 8 in the lower electrode 26, and the first pad 2 connected to the first electrode 7 in the lower electrode 26, and the second pad 3 connected to the second electrode 8 were patterned by photolithography. On them, the piezoelectric thin film 23 having the thickness of 1 μm was formed as the piezoelectric element by sputtering. Then, the third electrode 9 in the layered upper electrode 27 formed of Cr, the fourth electrode 10, the third pad 5, and the fourth pad 4 were formed. Then, the elastic plate 22 having also the function of the insulating layer and formed of $SiO_2$ was formed with the thickness of 1 μm. Lastly, the switching electrode 31 for shorting the terminal 12 connected to the RF circuit and the transmission and reception antenna 11 was formed of Ti in a layer manner. Thereafter, in order to form the movable portion 1*a* of the actuator 1, the substrate 6 was etched by heat phosphoric acid, and the different-in-level portion 6*a* (cavity) was formed.

Figure 4:
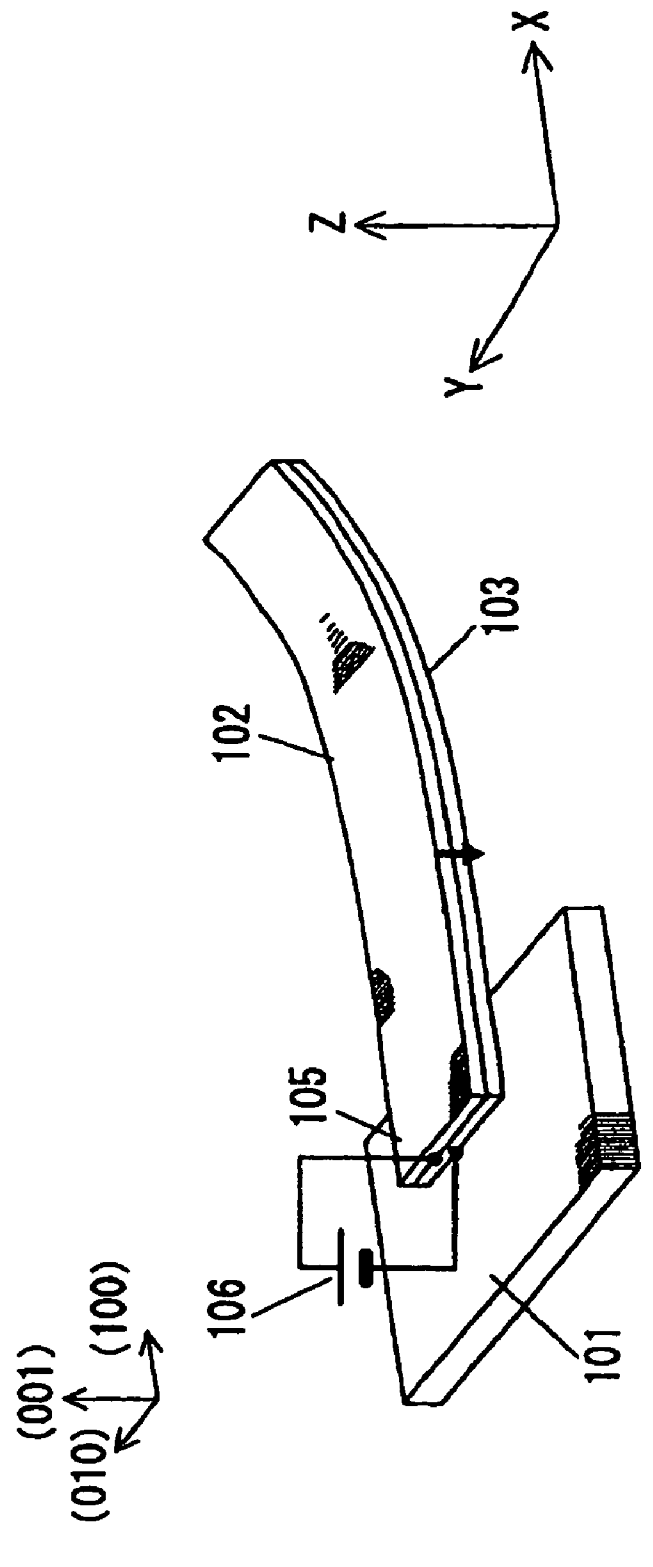
FIG. 4 (PRIOR ART)
FIG. 4 is a perspective view of a conventional switching apparatus.

The actuator having only one movable portion as shown in FIG. 4 was manufactured by the above method. Outer dimension of the element is 1 mm×4, that is, the element is square. The movable portion was formed with 0.8 mm length and 0.1 mm width. In this actuator, the voltage of 3V was applied to the upper and lower electrodes, and its maximum displacement was measured by a laser Doppler displacement measurement apparatus. As a result, the maximum displacement of about 4.4 μm was obtained in the center of the movable portion. A response speed to the maximum displacement was about 40 μs. Insertion loss was about 0.2 dB in the frequency of 2 GHz, and it was about 0.5 dB in the frequency of 20 GHz. Isolation was about 50 dB in the frequency of 2 GHz, and it was about 40 dB in the frequency of 20 GHz.

As described above, the switching apparatus described in the first mode is larger in the displacement amount, smaller in insertion loss, and higher in isolation than the conventional switching apparatus having the fixed—fixed beam constitution. Therefore, the consumed electric power is small for the switching apparatus, and interference of signals between two transmission and reception circuits is difficult to be produced, so that the occurrence of noise can be suppressed.

Second Embodiment

Figure 8:
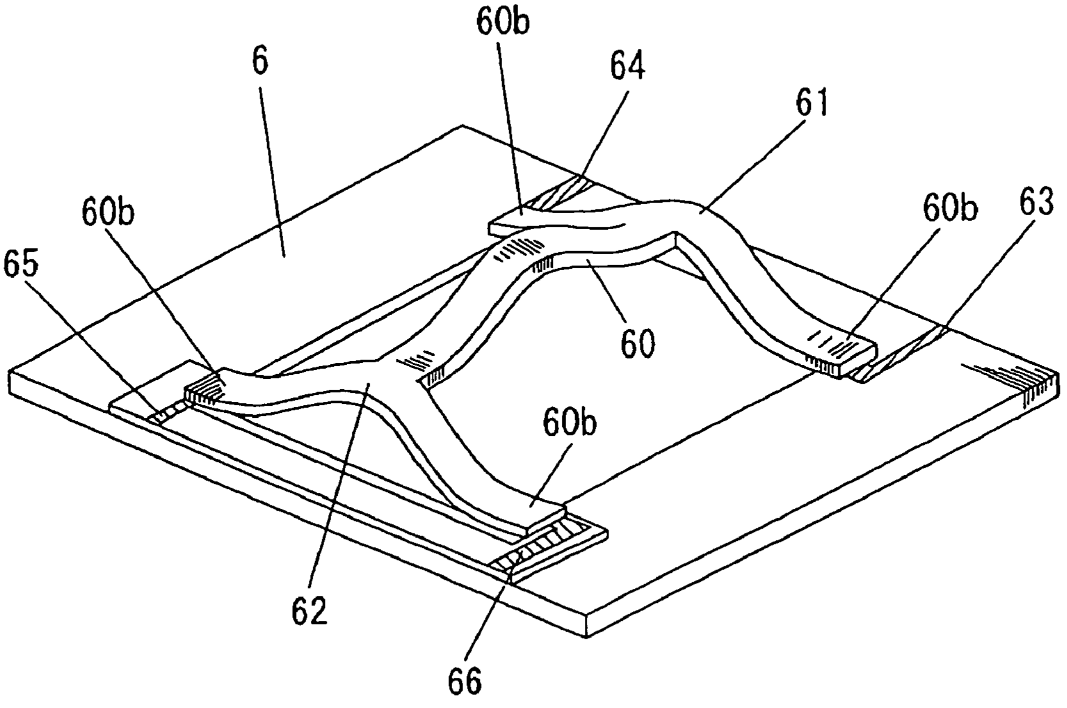
FIG. 8 is a perspective view of the switching apparatus in the second mode.

Next, a second mode for carrying out the invention will be described with reference to FIGS. 7 and 8. FIG. 7 is a front view of a switching apparatus in the second mode, and FIG. 8 is a perspective view of the switching apparatus in the second mode. The switching apparatus in this mode includes a first movable portion 60, a second movable portion 61 and a third movable portion 62. Both ends of the first movable portion 60 are coupled to the second movable portion 61 and the third movable portion 62 near their central portions. The coupled first movable portion 60, second movable portion 61, and third movable portion 62 are formed as a letter "H". Fixed portions 60*b* to a substrate 6 are provided only for the second movable portion 61 and the third movable portion 62, and coupled to the substrate 6. By combining the three movable portions, the displacement amount can be made larger.

An upper electrode and a lower electrode make a pair in the same shape. The electrodes are formed in each movable portion similarly to in the first mode. In this mode, since the first movable portion is connected to the nearly central portion of the second movable portion, a lowest point of the first movable portion becomes a maximum displacement portion of the second movable portion. Namely, the first movable portion moves relatively from the highest point of the second movable portion. Accordingly, the total displacement amount of the first movable portion from the substrate becomes larger than in the case where the switching apparatus does not have the second movable portion.

Another mode of the invention is characterized in that the piezoelectric element is formed by a thin film process. Since the piezoelectric element is composed of the thin film, it is possible to obtain high electric field strength even at a low voltage. Particularly, a condition of low-voltage drive, which is usually required when the switching apparatus is used in a mobile telephone, is satisfied. Further, by using the thin film process, size-reduction and price-reduction which are required similarly are satisfied simultaneously.

Next, specific embodiments suitable for the switching apparatus described in the invention will be described. The switching apparatus having three movable portions as shown in FIG. 8 was manufactured by a similar method to the above method. For the elastic plate, polyimide having 1 μm thickness was used. The outer dimensions of the element are 1 mm×4, that is, the element is square. The movable portion was formed with 0.8 mm length and 0.1 mm width. The first movable portion was patterned so as to couple to the central portions of a pair of the second movable portions. In this actuator, when a voltage of 3V was applied to the upper and lower electrodes, a maximum displacement of 6.5 μm was obtained at the central portion of the first movable portion. A response speed to the maximum displacement was about 60 μs. Insertion loss was about 0.2 dB in the frequency of 2 GHz, and it was about 0.5 dB in the frequency of 20 GHz. Isolation was about 50 dB in the frequency of 2 GHz, and it was about 40 dB in the frequency of 20 GHz.

As described above, in this embodiment, since both ends of the actuator are fixed, even if the film-shaped movable portion is formed, the film warp, which was the problem in the cantilever construction, is suppressed, and simultaneously the displacement amount, which was the problem in the fixed—fixed beam construction can be made equal to the displacement amount in the switch of the cantilever construction. Further, in the invention, since the movable portion 1*a* of the actuator 1 has the curved portion, better contact of the switching electrode 31 with the gap electrode 13 (short portion of the RF circuit) can be realized.

In the above examples, only the preferred examples are shown, and the electric applying method of the invention can be applied also to actuators having any shape. Further, the electric applying method may use direct current or alternating current. Further, though the piezoelectric element formed of the above material having the piezoelectric parameter is selected, even if any piezoelectric material and any piezoelectric parameter are used, similar effects are obtained by proper selection of the electric field direction. Further, selection of the elastic plate is also arbitrary according to designs of the switch, and similar effects to the above effects can be obtained by proper combination with the piezoelectric element.

Further, the constitutions in all the above modes and embodiments can be combined with each other.

In all of the above modes and embodiments, the direction of displacement is controlled by changing the applying direction of the electric field. However, in place, by making the polarizing direction of the piezoelectric element different partially, the displacement can be controlled. In this case, for example, the voltage above coercive electric field of the piezoelectric element is applied between the second electrode 8 in FIG. 2 and the fourth electrode 10 in the direction of +Z, and the region of the piezoelectric element between the second electrode 8 and the fourth electrode 10 is polarized in the direction of +Z. Thereafter the voltage above coercive electric field of the piezoelectric element is applied between the first electrode 7 and the third electrode 9 in the direction of −Z, and the region of the piezoelectric element between the first electrode 7 and the third electrode 9 is polarized in the direction of −Z. Also, also in the case where the electric field is applied in the same direction, the direction of the displacement becomes opposite. Therefore, a large displacement can be obtained. In this case, either the electrode group on the substrate side or the electrode group on its opposite side can be used.

According to the invention, by providing the curved portion for the actuator, it is possible to provide the switching apparatus which provides good contact in the switch contact, has low electric resistance, and has small insertion loss in the high-frequency band of giga Hertz.

What is claimed is:

1. A switching apparatus comprising:

a substrate;

a movable portion which has both ends fixed on said substrate and is operated in relation to said substrate;

a switching electrode which is electrically insulated from said movable portion and provided on said movable portion; and a gap electrode which is provided opposed to said switching electrode, and electrically conducts when said switching electrode comes into contact with the gap electrode with the operation of said movable portion, wherein said movable portion comprises:

a piezoelectric element;

a first electrode provided on the substrate side of said piezoelectric element;

a third electrode which is provided on the substrate side of said piezoelectric element and is electrically insulated from said first electrode;

a second electrode provided on the opposite side to the substrate side of said piezoelectric element so as to be opposed to said first electrode;

a fourth electrode which is provided on the opposite side to the substrate side of said piezoelectric element so as to be opposed to said third electrode and which is electrically insulated from said second electrode; and a voltage applying unit is provided, which applies voltages to at least any one of said first electrode and said second electrode, and at least any one of said third electrode and said fourth electrode.

2. The switching apparatus according to claim 1, wherein a direction of an electric field generated in the piezoelectric element between the first electrode and the second electrode by the voltages applied by the voltage applying unit is different from that generated between the third electrode and the fourth electrode.

3. The switching apparatus according to claim 1, wherein a relationship between a direction of an electric field and a direction of polarization in a first portion of the piezoelectric element located between the first electrode and the second electrode is different from a relationship between a direction of an electric field and a direction of polarization in a second portion of the piezoelectric element located between the third electrode and the fourth electrode.

4. The switching apparatus according to claim 1, wherein the substrate includes a fixing portion and a step portion, the both ends of the movable portion are fixed onto said fixing portion, and said movable portion operates on said step portion.

5. The switching apparatus according to claim 1, wherein the switching electrode is formed so as to stride over the second electrode and the fourth electrode on the top of the movable portion.

6. The switching apparatus according to claim 1, wherein the voltage applied between the first electrode and the second electrode is different from the voltage applied between the third electrode and the fourth electrode.

7. The switching apparatus according to claim 1, wherein the shape of the switching electrode during operation of the movable portion is, in its portion opposed to the gap electrode, convex toward the gap electrode.

8. The switching apparatus according to claim 7, wherein the convex shape of the contact portion of the switching electrode with the gap electrode is more approximate to a flat shape than the convex shape of the non-contact portion of the switching electrode with the gap electrode.

9. A switching apparatus comprising:

a substrate;

a movable portion which has both ends fixed on said substrate and can operate in relation to said substrate;

a switching electrode which is electrically insulated from said movable portion and provided on said movable portion; and a gap electrode which is provided opposed to said switching electrode and electrically conducts when said switching electrode comes into contact with the gap electrode with the operation of said movable portion, wherein said movable portion comprises:

a piezoelectric element;

first, third and fifth electrodes which are provided on the substrate side of said piezoelectric element and electrically insulated from one another;

second, fourth and sixth electrodes which are respectively opposed to said first, third and fifth electrodes with the substrate between on the opposite side to the substrate side of said piezoelectric element, and electrically insulated from one another; and a voltage applying unit is provided, which applies voltages to at least either said first electrode or said second electrode, at least either said third electrode or said fourth electrode, and either any one of said fifth electrode or said sixth electrode.

10. The switching apparatus according to claim 9, wherein a direction of an electric field generated in the piezoelectric element between the first electrode and the second electrode and between the fifth electrode and the sixth electrode by the voltage applied by the voltage applying unit is different from that generated between the third electrode and the fourth electrode.

11. The switching apparatus according to claim 10, wherein a direction of a stress generated in the piezoelectric element between the first electrode and the second electrode and between the fifth electrode and the sixth electrode by the voltage applied by the voltage applying unit is different from that generated between the third electrode and the fourth electrode.

12. The switching apparatus according to claim 11, wherein the substrate includes a fixing portion and a step portion, both ends of the movable portion are fixed onto said fixing portion, and said movable portion operates on said step portion.

13. The switching apparatus according to claim 9, wherein the switching electrode is formed on the fourth electrode on the top of the movable portion.

14. The switching apparatus according to claim 9, wherein the voltage applied between the first electrode and the second electrode, the voltage applied between the third electrode and the fourth electrode, and the voltage applied between the fifth electrode and the sixth electrode are different from one another.

15. The switching apparatus according to claim 14, wherein the voltage applied between the first electrode and the second electrode is the same as the voltage applied between the fifth electrode and the sixth electrode.

16. The switching apparatus according to claims 9, wherein the shape of the switching electrode during operating of the movable portion is, in its portion opposed to the gap electrode, convex toward the gap electrode.

17. The switching apparatus according to claim 16, wherein the convex shape of the contact portion of the switching electrode with the gap electrode is more approximate to a flat shape than the convex shape of the non-contact portion of the switching electrode with the gap electrode.

18. The switching apparatus according to claim 9, wherein the first electrode is formed near a first end of both ends of the movable portion, the fifth electrode is formed near a second end on the opposite side to said first end, and the third electrode is formed near a central portion of said movable portion.

19. A switching system using a piezoelectric element, comprising:

a piezoelectric element;

plural electrode pairs for applying electric fields to this piezoelectric element;

an electric wiring for supplying electric power to these electrode pairs, an electrode pair for electrically connecting an antenna and a high-frequency circuit for transmission and reception; and a coupler for matching said piezoelectric element to said high-frequency circuit, wherein the electric fields in the plural electrode pairs are applied to said piezoelectric element so that the directions of the electric fields are nearly opposite to each other between the adjacent electrode pairs.

20. The switching system according to claim 19, characterized by being packaged by a high-frequency shielding material.

21. The switching system according to claim 20, wherein said high-frequency shielding material is composed of glass or fused silica.

22. A switching apparatus using a piezoelectric element, comprising:

a piezoelectric element;

a first movable portion including the piezoelectric element;

a pair of second movable portions which couple to the first movable portion and include the piezoelectric element;

plural electrode pairs for applying electric fields to said first movable portion and said second movable portion; and an electric field applying unit which applies electric fields so that the directions of the electric fields are nearly opposite to each other between the adjacent electrode pairs of said plural electrode pairs.

23. The switching apparatus according to claim 22, wherein said first movable portion is coupled to the second movable portion in the largest displacement portion of said second movable portion.

24. A switching system using a piezoelectric element, comprising:

a piezoelectric element;

a first movable portion including the piezoelectric element;

a second movable portion provided around said first movable portion and including the piezoelectric element;

plural electrode pairs for applying electric fields to said first movable portion and said second movable portion;

an electric wiring for supplying electric power to these electrode pairs;

an electrode pair for electrically connecting an antenna and a high-frequency circuit for transmission and reception; and a coupler for matching said piezoelectric element to said high-frequency circuit, wherein the electric fields in the plural electrode pairs are applied to said piezoelectric element so that the directions of the electric fields are nearly opposite to each other between the adjacent electrode pairs.

* * * * *